United States Patent [19]

Tamba et al.

[11] Patent Number: 5,121,185
[45] Date of Patent: Jun. 9, 1992

[54] MONOLITHIC SEMICONDUCTOR IC DEVICE INCLUDING BLOCKS HAVING DIFFERENT FUNCTIONS WITH DIFFERENT BREAKDOWN VOLTAGES

[75] Inventors: Akihiro Tamba, Ome; Yutaka Kobayashi, Katsuta, both of Japan

[73] Assignee: Hitachi, Ltd., Tokyo, Japan

[21] Appl. No.: 253,666

[22] Filed: Oct. 5, 1988

[30] Foreign Application Priority Data

Oct. 9, 1987 [JP] Japan ............................... 62-253672
Jan. 14, 1988 [JP] Japan ................................... 63-6481

[51] Int. Cl.⁵ ............................................. H01L 27/02
[52] U.S. Cl. .................................. 357/42; 357/40; 357/43; 357/34; 357/35
[58] Field of Search .................. 357/43, 42, 40, 41, 357/34, 35, 23.4

[56] References Cited

U.S. PATENT DOCUMENTS

| 4,437,171 | 3/1984 | Hudson et al. ..................... 357/43 |
| 4,589,004 | 5/1986 | Yasuda et al. ...................... 357/43 |
| 4,806,499 | 2/1989 | Shinohara .......................... 357/43 |
| 4,825,274 | 4/1989 | Higuchi et al. ..................... 357/43 |
| 4,825,275 | 4/1989 | Tomassetti ......................... 357/43 |

FOREIGN PATENT DOCUMENTS

| 0052450 | 5/1982 | European Pat. Off. ............. 357/43 |
| 57-157539 | 9/1982 | Japan ................................. 357/43 |
| 0188862 | 11/1982 | Japan ................................. 357/43 |
| 0047757 | 3/1984 | Japan ................................. 357/43 |
| 0186359 | 10/1984 | Japan ................................. 357/43 |
| 0053762 | 3/1986 | Japan ................................. 357/43 |
| 0027254 | 1/1989 | Japan ................................. 357/43 |

OTHER PUBLICATIONS

"Process Techniques ... Chip", IBM Technical Disclosure Bulletin, vol. 30, No. 8, Jan. 1988.
Castrucci et al., "Bipolar ... Circuit", IBM Technical Disclosure Bulletin, vol. 16, No. 8, Jan. 1974.

*Primary Examiner*—Rolf Hille
*Assistant Examiner*—Minhloan Tran
*Attorney, Agent, or Firm*—Antonelli, Terry Stout & Kraus

[57] ABSTRACT

A monolithic semiconductor integrated circuit device includes bipolar transistors and MOS transistors constituting plural blocks formed in a single semiconductor substrate and capable of performing different functions. The bipolar transistors in the blocks have different breakdown voltages and different operation speeds due to the selection of different resistances of their collector regions.

13 Claims, 18 Drawing Sheets

F I G. 7
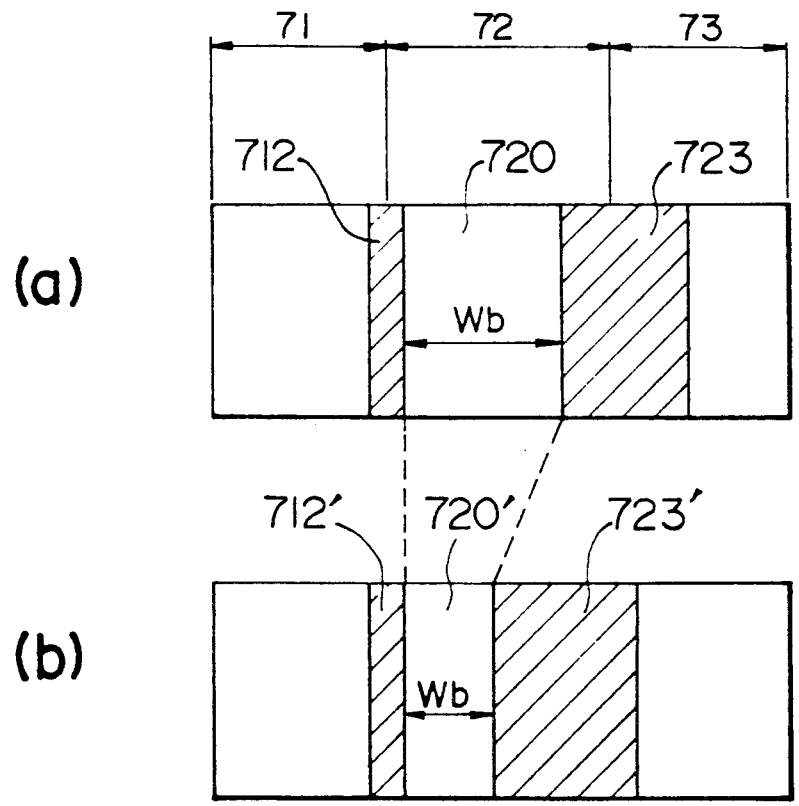

5,121,185

MONOLITHIC SEMICONDUCTOR IC DEVICE INCLUDING BLOCKS HAVING DIFFERENT FUNCTIONS WITH DIFFERENT BREAKDOWN VOLTAGES

BACKGROUND OF THE INVENTION

This invention relates to a semiconductor device constituting a monolithic semiconductor IC device including a plurality of bipolar transistors formed in a single semiconductor substrate, and a monolithic semiconductor IC device including a bipolar transistor and a MOS transistor in a single semiconductor substrate.

Conventionally, in a Bi-CMOS LSI device (a large scale integrated circuit device including bipolar transistors and complementary metal-oxide-semiconductor field effect transistors), the performance of the constituent bipolar transistors (cutoff frequency $f_T$ and breakdown voltage) is the same throughout the LSI chip. This performance is determined by such a transistor which needs the highest breakdown voltage. The breakdown voltage and the cutoff frequency of a transistor are in the relation of trade-off to each other.

With respect to IC devices which include bipolar transistors other than Bi-CMOS LSI devices, there is a concept, as proposed in JP-A-57-157539, of partially differentiating the thickness of the epitaxial layer to constitute a circuit with bipolar transistors of different operation speed (cutoff frequency) and different breakdown voltage. In this case, the breakdown voltage is made different between bipolar transistors constituting the logic circuit provided with memory portion and bipolar transistors constituting the output linear circuit. In other words, the breakdown voltage is the same for all the bipolar transistors constituting the logic circuit.

The breakdown voltage needed for a bipolar transistor in a monolithic semiconductor IC device differs depending on what part or block of executing various functions the bipolar transistor under interest constitutes.

For example, a monolithic semiconductor IC device constituting a DRAM device may be a Bi-CMOS LSI device including such blocks as disposed as schematically shown in FIG. 1. Namely, the DRAM device includes an input circuit block 15, a decoder block 16, a word line driver block 17, a memory cell block 18, a sense amplifier block 19, and an output circuit block 20.

In the DRAM device constructed as above, the input circuit block 15 and the output circuit block 20 are formed only of those bipolar transistors which operate in the small signal region (the small signal being, for example, a voltage signal having an amplitude of about 1 V or lower) in order to improve the operation speed. The decoder block 16, the word line driver block 17 and the memory cell block 18 have circuit structures including CMOS transistors in order to reduce the power consumption and to increase the degree of integration. Here, however, the decoder block 16 and the word line driver block 17 also include bipolar transistors operating in the large signal region (the large signal being, for example, a voltage signal having an amplitude corresponding to about 0.8 to 1.2 times the supply voltage to the device) because there is a necessity to drive a multiplicity of memory cells at a high speed. The sense amplifier block 19 may also include bipolar transistors operating in the large signal region.

Now, a specific structure of the DRAM device having the structure as described above will be described referring to FIG. 2.

In the figure, numeral 11 denotes a bipolar transistor, 12 a p type MOSFET (hereinafter, referred to as PMOS), 13 an n type MOSFET (hereinafter, referred to as NMOS), and 14 a memory cell.

The bipolar transistor 11 is particularly that transistor which constitutes an input/output circuit for the memory cell, and operates in the small signal region (i.e. handles small amplitude signals). The PMOS 12 and the NMOS 13 constitute a CMOS by connecting one of their drain terminals with one of their source terminals.

Numeral 6 denotes a p type semiconductor substrate in the surface of which an n+ type embedded layer 7 and a p+ type embedded layer 9 are formed by the conventional technique such as ion implantation or diffusion.

On the embedded layers, an n type well region 8-1 (n type epitaxial layer) which constitutes a collector region of a bipolar transistor, an n type well region 8-2 (n type epitaxial layer) which constitutes a channel layer of the PMOS, and a p type well 10 (p type epitaxial layer) are formed by the technology of the epitaxial growth.

On the n type wells 8-1, 8-2 and the p type well 10, semiconductor regions 71, 72, 73, 74, 75, 76 and 77 are formed through ion implantation or diffusion.

A field insulating film 31 for isolating the elements from one another is formed for example of SiO$_2$ by selective thermal oxidation.

Numeral 33 denotes electrodes for the respective elements, which electrodes are formed by applying an inter-layer insulator film 32 on the whole surface, then opening windows for contacting electrodes by dry etching, vacuum-depositing a thin film of metal such as aluminum (Al), and removing those portions of the aluminum thin film by etching which are between the elements.

Here, in the conventional Bi-CMOS LSI device as described above, the n type well regions 8-1 which constitute the collector regions of the bipolar transistors 11, are formed under the same conditions and have the same thickness and the impurity concentration, regardless of whether the transistor should operate in the small signal region or in the large signal region. Further, the conditions for forming the n type well region 8-1 are also the same as those for forming the n type well region 8-2 which constitutes the channel layer of the PMOS 12. Thus in the LSI, the impurity concentration in the n type well region 8-1 is the same as that in the n type well region 8-2.

Now, referring back to FIG. 1 again, the breakdown voltage required for the respective blocks will be described. For example, the bipolar transistors in the circuit blocks 17 and 19 directly connected to the memory cell block 18 should have a breakdown voltage of 8 volts or more. The bipolar transistors in the indirect peripheral circuit block 16 need a breakdown voltage of 5 volts or more. The bipolar transistors in the ECL (emitter coupled logic) circuit block included in the IC device should have a breakdown voltage of around 3–4 volts. As stated above, the cutoff frequency $f_T$ which is a measure of the high speed operation and the breakdown voltage in a bipolar transistor are in the mutual relation of trade-off. To make the breakdown voltage of a bipolar transistor high is to put a disturbance for making the operation speed of the bipolar transistor high (i.e. the cutoff frequency cannot be made high). Therefore, to make the breakdown voltages of all the bipolar transistors in a single LSI chip uniform constitutes a burden for increasing the operation speed of the monolithic IC device.

Also, as the impurity concentration of the collector region of a bipolar transistor is made higher, the larger becomes the possibility of increasing the operation speed thereof. As will be stated later, however, the operation speed of the monolithic IC device including the bipolar transistor is not necessarily improved.

SUMMARY OF THE INVENTION

An object of this invention is, in a monolithic semiconductor IC device having a plurality of blocks formed in a single semiconductor substrate and having different functions, to give an appropriate operation speed and an appropriate breakdown voltage to each block, which are required in correspondence to the function of the respective block, thereby improving the operation speed of the IC device.

Another object of this invention is to provide a technique of varying the breakdown voltages of the bipolar transistors in a single chip according to the location, thereby enabling to fully extract the high speed operability of the bipolar transistors.

According to a main aspect of this invention, in a monolitic semiconductor IC device having a plurality of blocks formed in a single semiconductor substrate and having mutually different functions, at least one of the bipolar transistors contained in at least one of the above-mentioned blocks has a different resistance value of its collector region from the resistance value of the collector region of the bipolar transistor contained in another block, the collectors of the bipolar transistors having identical cross-sections through which carriers flow. By so designing, a plurality of blocks in a single semiconductor substrate will have the operation speeds and the breakdown voltages required in accordance with their functions.

Variation of the resistance of the collector regions of the bipolar transistors in respective blocks in order to give different operation speeds and breakdown voltages to different blocks contained in a monolithic semiconductor IC device may be achieved by controllably adjusting (determining) the length (thickness) of the collector region in the transport direction of carriers contributable to the conduction of the bipolar transistor, or the impurity concentration in the collector region.

Now, description will be made on the study and investigation by the present inventors, which have formed the basis for obtaining the above-mentioned technical feature.

FIG. 3 shows a cross-sectional structure of an npn bipolar transistor isolated by a silicon oxide ($SiO_2$) layer 31. The thickness of the lightly doped collector layer (collector region) 8 of a bipolar transistor is determined by the thickness of a lightly doped silicon (Si) layer 10 formed on an $n^+$ type embedded layer (heavily doped region) 7 and including the lightly doped collector layer 8, provided that the conditions for forming an emitter layer (emitter region) 71 and a base layer (base region) 72 are kept constant. The breakdown voltage of a bipolar transistor is mainly determined by the width (thickness) and the concentration of the lightly doped collector layer 8. In a bipolar transistor which requires a large breakdown voltage, the width of the collector lightly doped layer 8 may be made large. Then, the cutoff frequency, however, becomes smaller. A bipolar transistor which requires only a small breakdown voltage may have a reduced width of the collector lightly doped layer 8, thereby increasing the cutoff frequency $f_T$ (making the operation speed high).

Taking the above analysis into consideration, an embodiment of this invention adopts varying the thickness or width of the collector lightly doped layers 8 along the transport direction of carriers contributing to the conduction of the bipolar transistor, in a single chip.

An example of a Bi-CMOS DRAM device will be described referring to FIG. 4. In a p type silicon substrate 6, the depths of $n^+$ type embedded layers 42 are changed. In other words, the thicknesses of lightly doped layers 43 which constitute the collector lightly doped layers of bipolar transistors are changed to vary the breakdown voltages (and the cutoff frequencies). The width of the lightly doped layer 43 is made largest in a word line driver circuit block 17 which requires the highest breakdown voltage, and is gradually decreased from the word line driver block 17, through the decoder block 16 to the input circuit block 15. Therefore, the breakdown voltages and the cutoff frequencies $f_T$ in the blocks A, B, C, D and E shown in FIG. 4 are in the following unequality relations.

breakdown voltage: block C > blocks B, D > blocks A, E $f_T$: blocks A, E > blocks B, D > block C As described above, a Bi-CMOS LSI device fully exhibiting the features of the bipolar transistor is realized by changing the breakdown voltages and the cutoff frequencies of the bipolar transistors in a single semiconductor chip.

Thus, in a single semiconductor chip including a plurality of blocks, the widths of the collector regions of the bipolar transistors in respective blocks along the transport direction of carriers contributing to the conduction of the transistor are changed according to whether the transistor is in a directly connected peripheral circuit block, or in an indirectly connected peripheral circuit block or in an input/output circuit block, to form bipolar transistors which have different breakdown voltages (different high speed operabilities) in different circuit blocks. Namely, the breakdown voltage of the bipolar transistor is varied in the unit of a circuit block. Then, the operation speed of the LSI device can be made higher as shown in FIG. 5, while maintaining the breakdown voltage of the LSI device as required. In the prior art, the breakdown voltage and the cutoff frequency $f_T$ of bipolar transistors are determined by the conditions for the directly connected peripheral circuit block which needs the highest breakdown voltage (for example, the word line driver block). In contrast to such prior art, the cutoff frequency $f_T$ is made higher as the required breakdown voltage becomes smaller when the transistor is located in the indirectly connected peripheral circuit block (decoder or sense amplifier block), and further in the input/output circuit block. Thus, as shown in FIG. 5, the delay times of the directly connected peripheral circuit block and the input/output circuit block can be shortened compared to the prior art.

Further, when improvement in the operation speed of A Bi-CMOS LSI device is intended, the base width of the bipolar transistor may be reduced to improve the cutoff frequency $f_T$. It is difficult, however, to reduce the base width to a large extent, because the reduction is limited by the conditions of the manufacturing processes such as the annealing time and the annealing temperature. The cutoff frequency $f_T$ can be increased also by increasing the impurity concentration of the collector lightly doped region (hereinafter, referred to as collector impurity concentration).

FIG. 6 is a graph showing a relation between the collector impurity concentration of the bipolar transistor acting in the small signal range and the cutoff frequency $f_T$. Here, the thickness of the n type well (and the p type well) formed in the epitaxial layer was set at about 1.0 μm, the emitter width was set not larger than 0.1 μm and the base width was set not larger than 0.1 μm.

It can be seen from FIG. 6 that the cutoff frequency $f_T$ increases from about 8 GHz to about 12 GHz when the collector impurity concentration is raised from $10^{16}$ cm$^{-3}$ to $10^{17}$ cm$^{-3}$.

In short, when only the improvement in the operation speed of the bipolar transistor acting in the small signal range is considered, the impurity concentration of the n type well which determines the collector impurity concentration is higher, the better.

Therefore, for improving the operation speed of the Bi-CMOS LSI device, it can be considered to increase the quantity of impurity to be introduced in the well.

When the impurity concentration of n type wells, e.g. in the structure of FIG. 2, is simply increased, the junction capacitance between the n type well 8-2 and the source/drain regions 173 of the PMOS transistor 12 should increase. Thus, the operation speed of the PMOS transistor may be lowered.

Namely, when the impurity concentration of the n type wells is raised, the operation speed of the input circuit block, and the output circuit block, etc. of the Bi-CMOS LSI device which are formed solely of bipolar transistors becomes faster, but the operation speed of those circuit blocks of the Bi-CMOS LSI device which are constituted by CMOS transistors including a PMOS transistor may be lowered, on the contrary to the above.

Further, it has been experimentally confirmed by the present inventors that the cutoff frequency $f_T$ of a bipolar transistor acting in the large signal range is not so improved by the increase in the collector impurity concentration as in the small signal range, even though it is also a bipolar transistor.

When the collector impurity concentration is raised, the depletion region grows more into the base region to reduce the effective base width $W_b$. This may be accompanied with a problem that the withstand voltage between the collector and the emitter may be lowered.

According to another embodiment of this invention, in a monolithic semiconductor IC device having bipolar transistors and insulated-gate field-effect transistors or MOS transistors on a single semiconductor substrate, the collector impurity concentration of a bipolar transistor is made higher than the impurity concentration in the channel region of a MOS transistor.

According to a further embodiment of this invention, in a monolithic semiconductor IC device having a plurality of bipolar transistors on a single semiconductor substrate, the impurity concentration in the collector region of a bipolar transistor acting in the small signal range is made higher than the impurity concentration in the collector region of a bipolar transistor acting in the large signal range.

The cutoff frequency $f_T$ of a bipolar transistor can be expressed, using the time for charging the emitter-base junction capacitance T1, the transit time of carriers in the effective base region T2, the time for charging the base-collector junction capacitance T3, and the transit time of carriers in the collector depletion region T4, as follows.

$$f_T = 1/\pi(T1 + T2 + T3 + T4).$$

Among the four factors, the largest contribution is given by the effective base transit time T2. This factor T2 becomes smaller as the effective base width $W_b$ becomes smaller. When the collector impurity concentration in the bipolar transistor is raised, the extent of the effective base is limited and the depletion region extends more into the base region, thereby reducing the effective base width $W_b$.

FIG. 7 schematically shows how the effective base width $W_b$ is narrowed by an increase in the collector impurity concentration. In the figure, reference numeral 71 represents an emitter region, 72 a base region, 73 a collector region, 712 an emitter-base depletion region, 720 and 720' effective base regions, 723 and 723' base-collector depletion regions.

In part (a) of the figure, which illustrates the case of the low impurity concentration collector wherein the collector impurity concentration is sufficiently low compared to the base impurity concentration, the base-collector depletion region 723 mainly extends into the collector region 73. Since the extent of the depletion region 723 into the base region 72 is small, the effective base width $W_b$ remains wide.

In part (b) of FIG. 7, the collector impurity concentration is raised. Along with the increase in the collector impurity concentration, the extention of the base-collector depletion region 723' into the base region 72 becomes larger and hence the effective base width $W_b$ is narrowed as shown at 720'.

As described above, by an increase in the collector impurity concentration, the effective base width $W_b$ is reduced and the cutoff frequency $f_T$ is improved.

Namely, in a semiconductor monolithic IC device including bipolar transistors of the above-described structure, the operation speed of those portions which are constituted only of bipolar transistors can be improved. When the entire Bi-CMOS LSI device is considered, the operation speed of the Bi-CMOS LSI can be improved by the increment in the operation speed of the bipolar transistors.

In an LSI device having bipolar transistors acting in the small signal range and bipolar transistors acting in the large signal range, which are formed in a same semiconductor substrate, the operation speed of the bipolar transistors acting in the small signal range can be improved. Seeing the LSI device as a whole, the operation speed of the LSI device can be improved by the improvement of the small signal bipolar transistors.

BRIEF DESCRIPTION OF THE DRAWINGS

FIG. 7a-b is a model diagram illustrating how the effective base width in the vertical bipolar transistor is reduced by an increase in the impurity concentration in the collector region.

DESCRIPTION OF THE PREFERRED EMBODIMENTS

Figure 3:
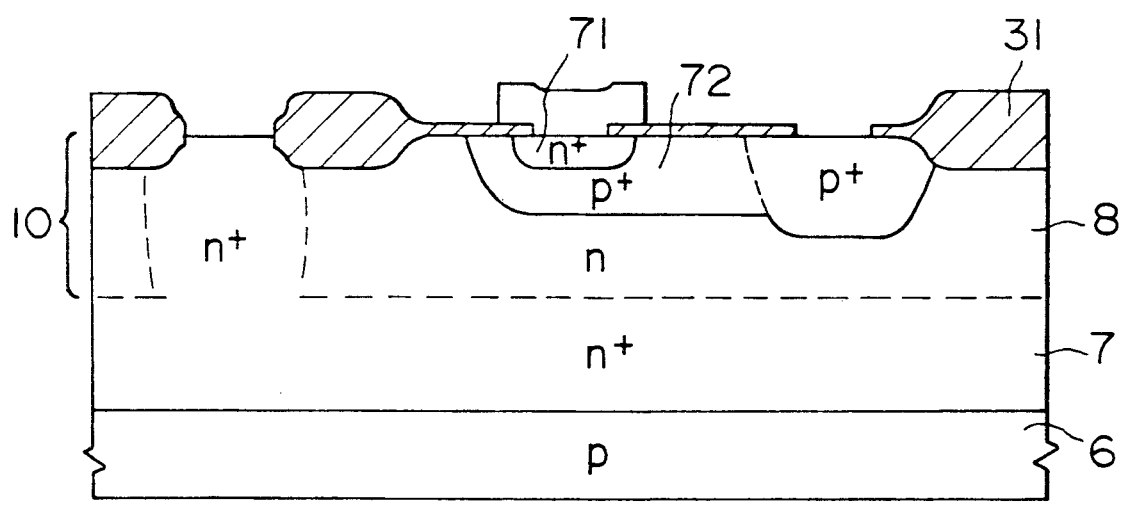
FIG. 3 is a cross-section of a vertical bipolar transistor.
Figure 4:
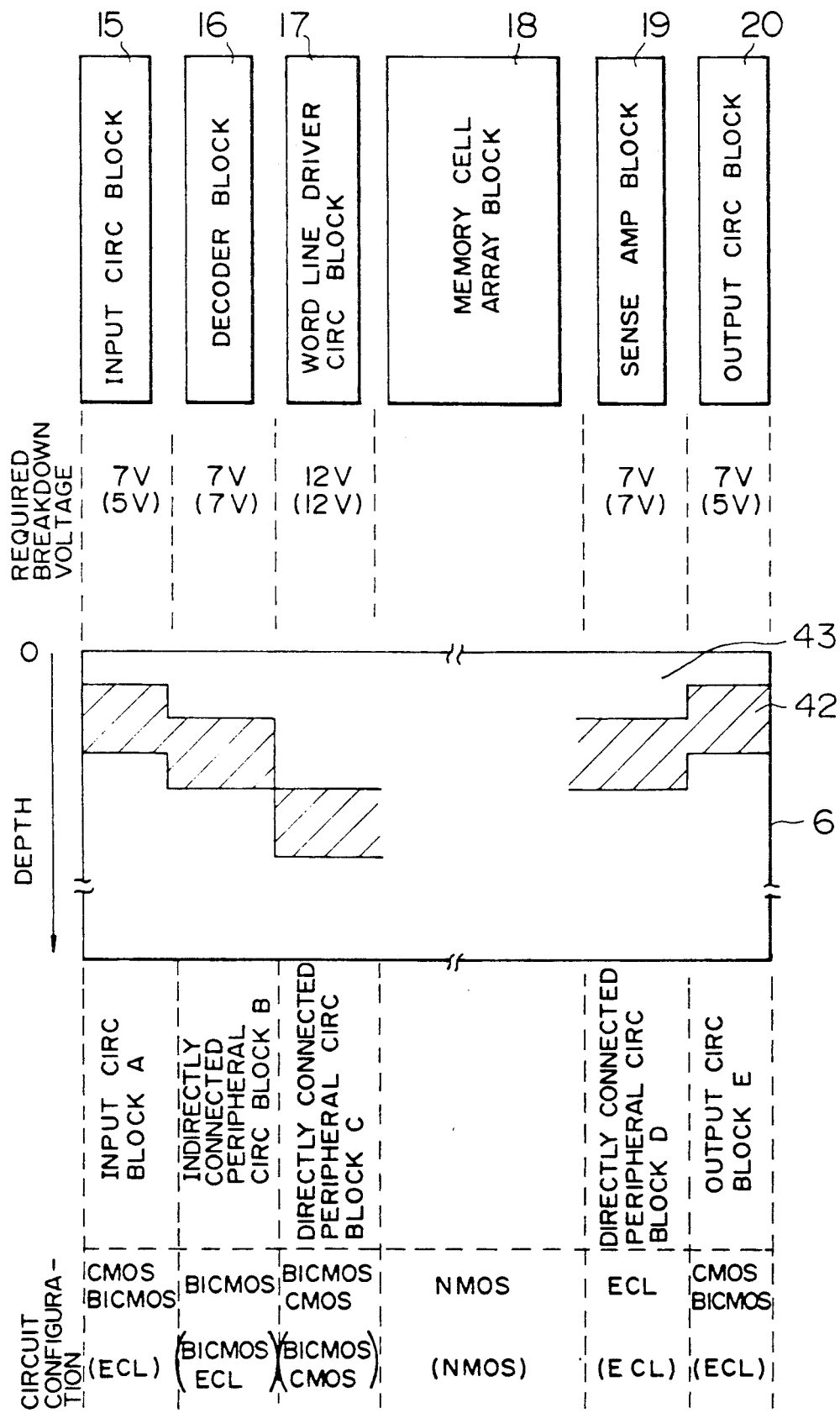
FIG. 4 is a model diagram of a Bi-CMOS DRAM device according to an embodiment of this invention.
Figure 5:
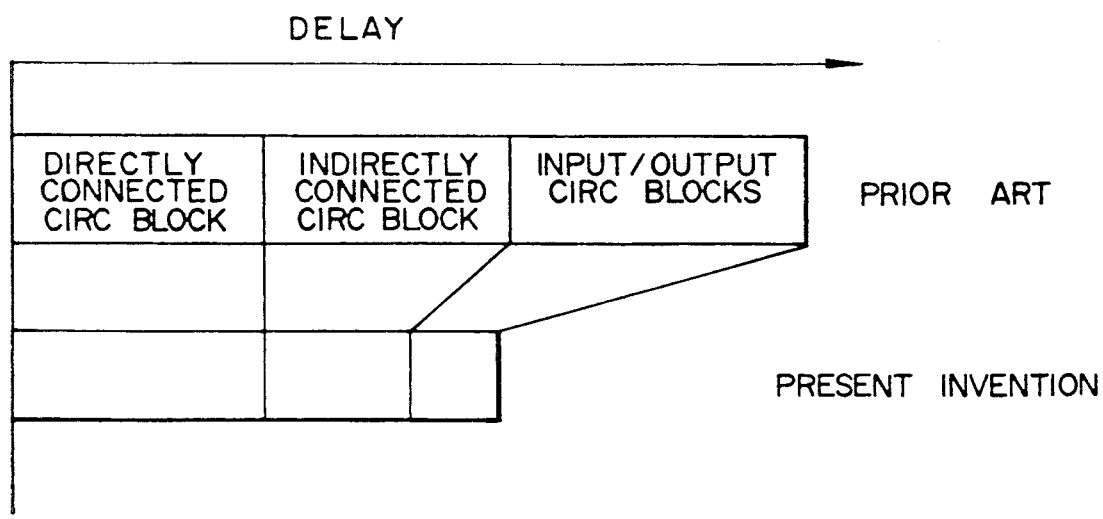
FIG. 5 is a diagram illustrating an effect of the effective base width narrowing according to an embodiment of this invention.
Figure 6:
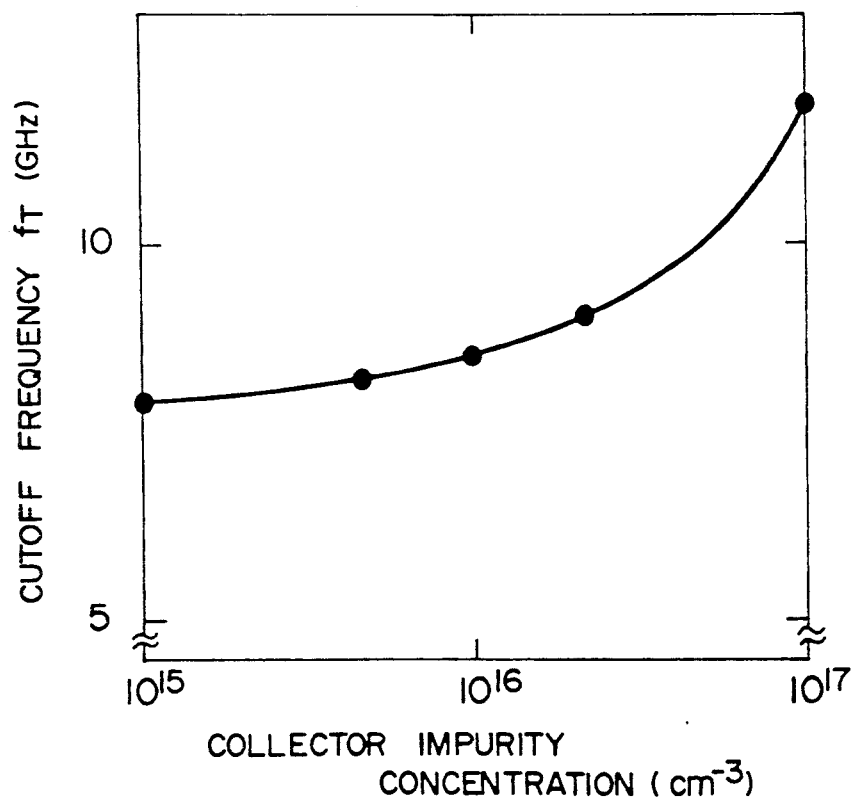
FIG. 6 is a graph showing the relation between the cutoff frequency of the vertical bipolar transistor and the impurity concentration in the collector region of the transistor.
Figure 8:
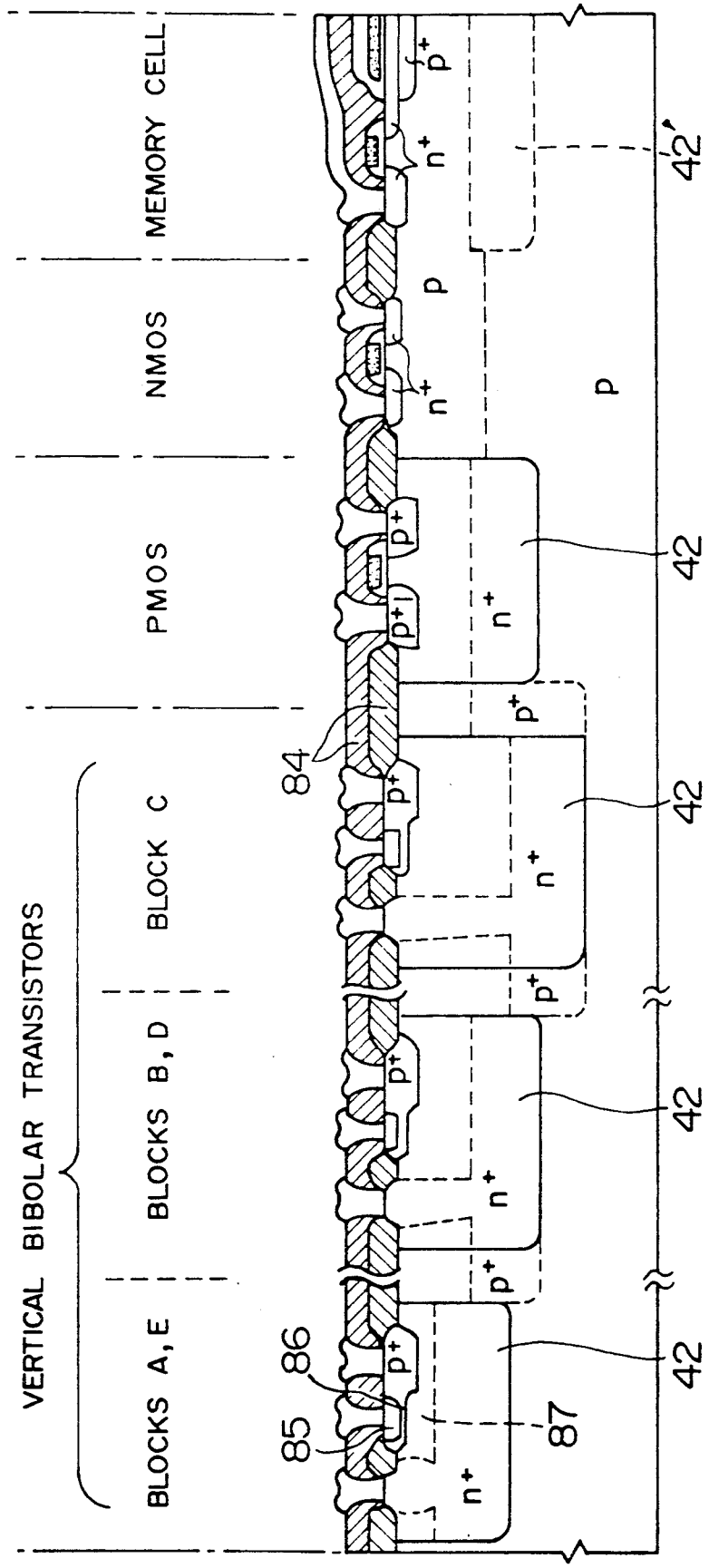
FIGS. 8 and 9 are partial cross-sections of a Bi-CMOS DRAM device according to an embodiment of this invention.

FIG. 8 shows an example of a partial cross-section of a Bi-CMOS DRAM device structure, in which a plurality of vertical bipolar transistors as shown in FIG. 3 are formed in a silicon substrate having n+ type embedded layers as shown in FIG. 4.

In FIG. 8, blocks A and E, blocks B and D, and a block C include respective bipolar transistors, each having an emitter region 85, a base region 86, and a collector region (i.e. collector lightly doped region) 87. The depth of the n+ type embedded region or layer 42, and hence the breakdown voltage becomes large in the order of the blocks A and E, the blocks B and D, and the block C. The operation speed, on the contrary, decreases in this order. The thickness of the collector region 87 defined by the depth of the embedded layer 42 is the length of the region 87 along the moving direction of carriers contributing to the conduction of the transistor. Reference numeral 42' denotes a p+ type embedded region or layer. Reference numeral 84 denotes an SiO₂ isolation region.

Regarding the bipolar transistor, the vertical npn bipolar transistor having an n+ type embedded layer has been described. The concept of the above embodiment holds in completely similar way in other bipolar transistors, e.g. lateral bipolar transistor.

Figure 9:
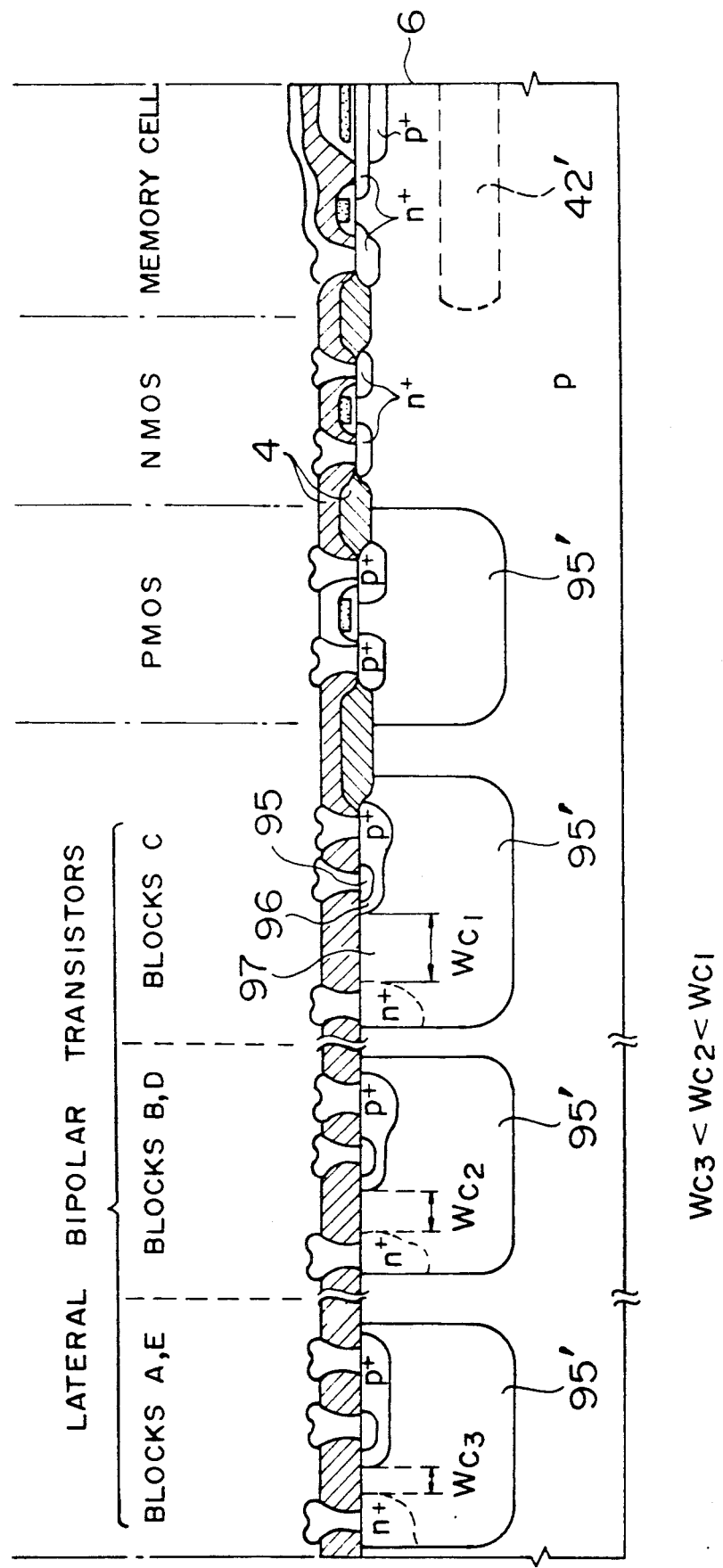

FIG. 9 shows a Bi-CMOS DRAM device in which the vertical npn bipolar transistors in the Bi-CMOS DRAM device of FIG. 8 are substituted with lateral bipolar transistors, each having an emitter region 95, a base region 96 and a collector region 97. The collector region 97 is formed of a surface portion of an n type well 95' formed in a p type substrate 1'. The width of the collector lightly doped region 97 is shown at $W_{c1}$, $W_{c2}$ and $W_{c3}$, which are the lengths of the respective regions 97 along the moving direction of carriers contributing to the conduction of the transistor. For establishing an unequality relation of the breakdown voltage of the transistors as represented by $$A, E < B, D < C,$$

the widths of the collector lightly doped regions $W_{c1}$, $W_{c2}$ and $W_{c3}$ are set to satisfy $$W_{c3} < W_{c2} < W_{c1}.$$

Figure 10A:
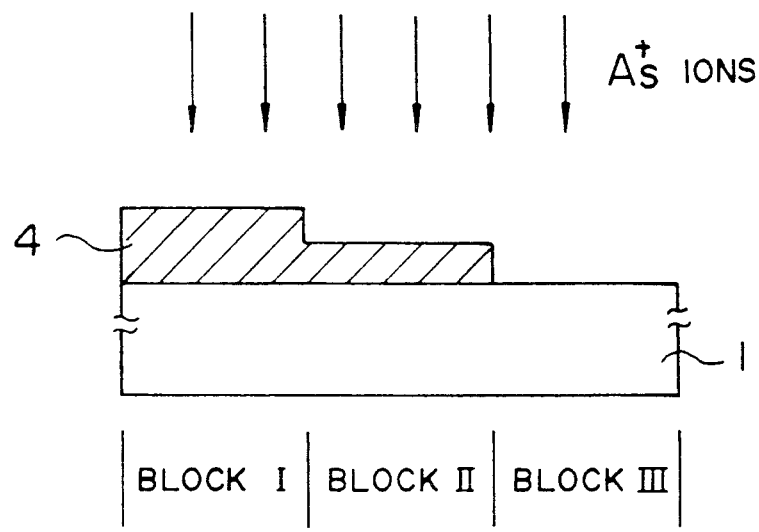
FIGS. 10a and 10b are partial cross-sections of a semiconductor substrate, illustrating the ion implantation to be achieved in an embodiment of this invention.
Figure 10B:
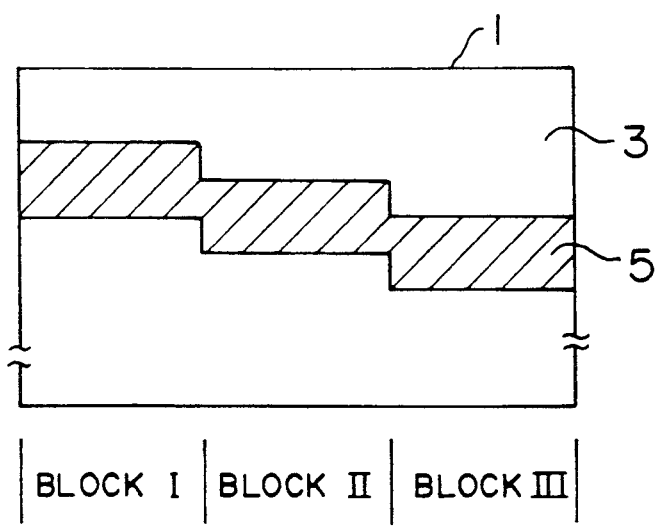

A semiconductor substrate having a structure as shown in FIG. 4 can be produced by forming n+ type embedded layers 42 e.g. through high energy ion implantation. An example of forming an n+ type embedded layer 42 in a silicon substrate 6 will be described referring to FIGS. 10a and 10b. First, as shown in FIG. 10a, an SiO₂ (or Si₃N₄) layer 4 having a stepwisely changing thickness is formed partially on a silicon substrate 1. The film thickness of the oxide layer 4 is so selected that it is thicker in the block I than in the block II. Then, arsenic ions As+ (or phosphorus ions P+) are ion-implanted into the substrate 1 through the oxide mask 4 at an acceleration energy of around 3-5 MeV. As the result, n+ type embedded layers are formed deep in the silicon substrate. The depth of the embedded layer becomes deeper in the order of the block I with the thick oxide—the block II with the thin oxide—the block III without any oxide layer. Therefore, the width of the lightly doped layers 3 becomes thicker in the order of the block I—the block II—the block III as shown in FIG. 10b. In this way, a substrate which enables varying the breakdown voltage and the cutoff frequency $f_T$ in a same chip and fully extracting the high speed operability of the LSI device, can be manufactured.

Function of the arsenic ion implantation through the oxide mask layer 4 in the process of FIGS. 10a and 10b will be described hereinbelow.

Figure 11A:
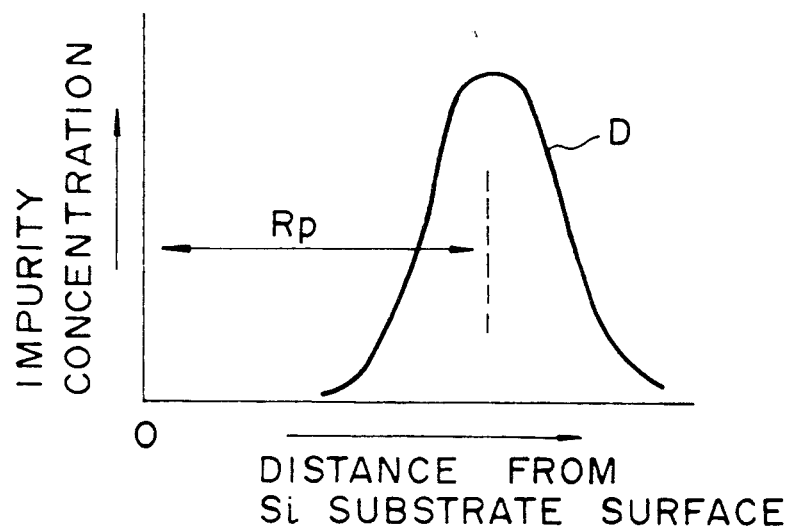
FIGS. 11a and 11b are graphs illustrating concentration profiles of the implanted impurity ion.

When n type impurity ions are implanted at a high acceleration energy into a bare silicon substrate without an oxide layer to form an embedded n+ type layer 2, the n type impurity ions or atoms will distribute in a Gaussian distribution D with a mean implantation depth $R_p$ and a standard deviation $\sigma$ as shown in FIG. 11a, being similar to the case of low acceleration energy (300–500 KeV). For example, when arsenic ions As+ are implanted into a silicon substrate at an acceleration energy of 3 MeV, the mean implantation depth $R_p$ is about 2 μm and the standard deviation $\sigma$ is about 0.4 μm.

Figure 11B:
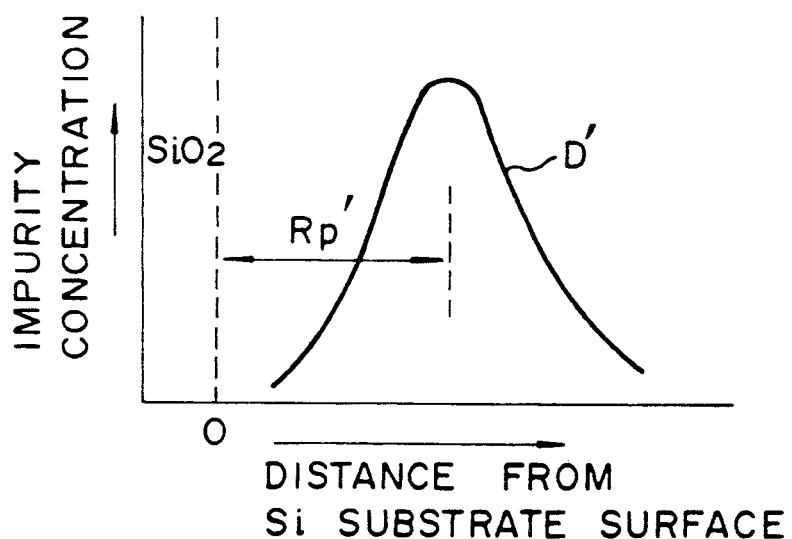

When ions are implanted into a silicon substrate covered with a silicon oxide layer, the silicon oxide layer serves to block the ions similar to silicon. Then, the distribution of the ions D' in the silicon substrate will be shifted towards the surface of the silicon substrate compared to the case of having no silicon oxide layer, as shown in FIG. 11b. In FIG. 11b, the mean implantation depth $R_p'$ is smaller than $R_p$ of FIG. 11a.

When arsenic ions are ion-implanted at an acceleration energy of 3 MeV into a silicon substrate covered with a silicon oxide layer having a thickness of 0.2 μm, the mean implantation depth $R_p'$ becomes about 1.75 μm. That is, an n⁻ type embedded layer is formed shallower by about 0.25 μm, compared to 2 μm in the case of no oxide layer.

As described above, the depth of the n⁻ type embedded layer can be controlled by an $SiO_2$ layer, the thickness of which can be varied to control the depth. Namely, the width of the collector layer can be controlled according to the location in the substrate.

According to this embodiment, there may be no step of forming an epitaxial layer on a substrate for embedding an n⁺ type layer. Thus, the manufacturing cost of a substrate can be reduced.

Figure 12:
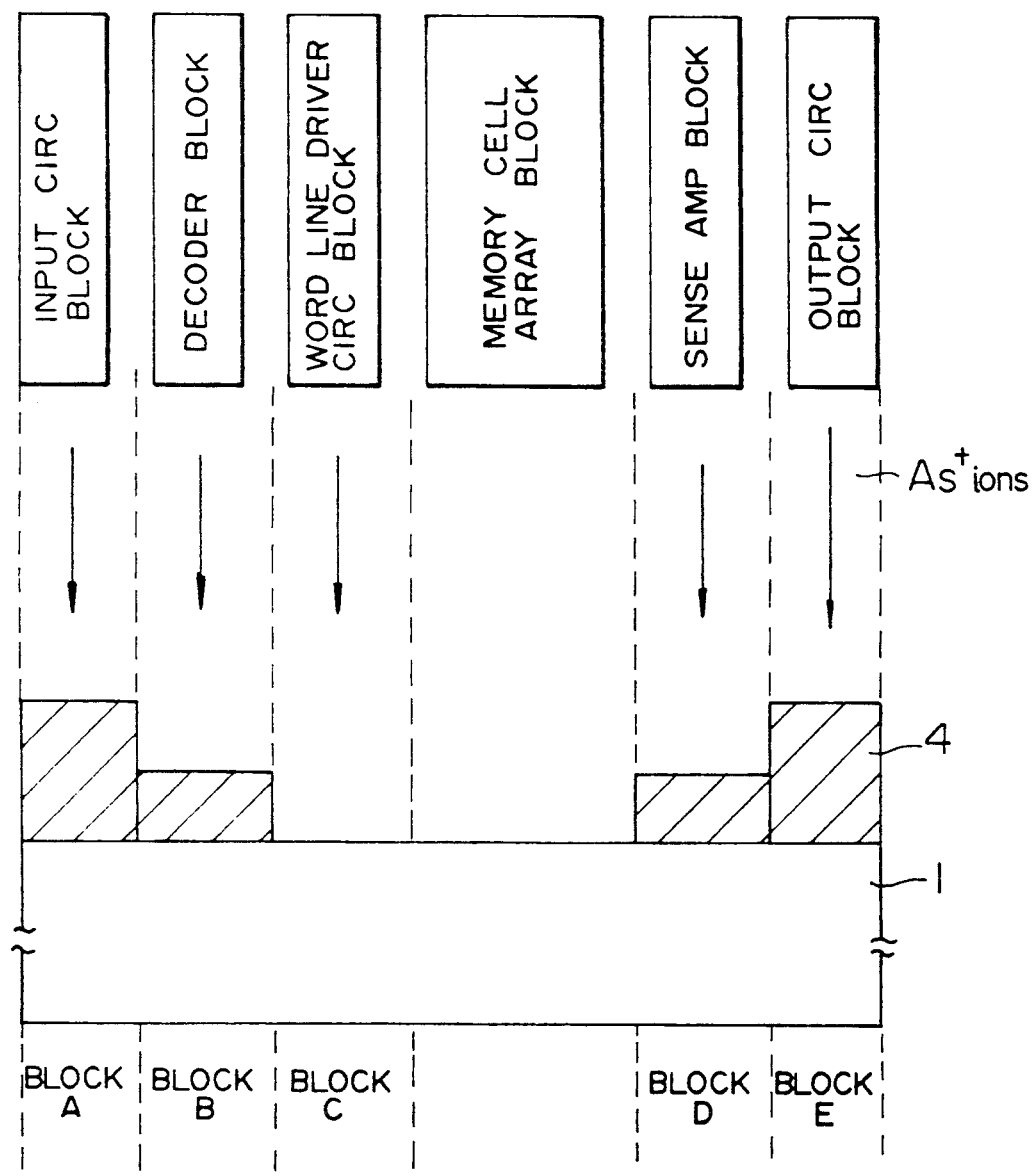
FIG. 12 is a schematic diagram for illustrating the manufacture of a Bi-CMOS device, employing the ion implantation as shown in FIGS. 10a and 10b.

An embodiment of manufacturing bipolar transistors by forming a p type silicon substrate 1 having a structure as shown in FIG. 4 through high energy ion implantation as shown in FIGS. 10a and 10b will be described hereinbelow. For forming the n⁻ type embedded layers 42 as shown in FIG. 4, an $SiO_2$ layer 4 having a thickness distribution on the respective blocks as shown in FIG. 12 is formed. The thickness of the oxide layer 4 is set at 0.4 μm on the input circuit block A and the output circuit block E, and is set at 0.2 μm on the decoder block B and the sense amplifier block D. Arsenic ions are implanted into the silicon substrate 1 through the mask 4 at an acceleration energy of 3 MeV and a dose of $1.7 \times 10^{15}/cm^2$ to form n⁻ type embedded layers 2.

Then, bipolar transistors as shown in FIG. 8 are made as follows. First, ion implantation of phosphorus ions (P⁻) at an acceleration energy of 125 KeV and at a dose of $1.7 \times 10^{13}/cm^2$ is carried out to form collector lightly doped layers 87. After the ion implantation, field oxide films made of $SiO_2$ and having a thickness of 5000 Å are formed by steam oxidization at 1000° C. for 90 minutes, to isolate the respective elements. Base layers 86 are formed by ion implantation of boron ions (B⁻) at an acceleration energy of 30 KeV and at a dose of $1.3 \times 10^{14} cm^2$. After emitter apertures are formed, emitter 20 layers 85 are formed by ion implantation of arsenic ions (As⁺) at an acceleration energy of 80 KeV and at a dose of $6 \times 10^{15}/cm^2$. After the base ion implantation for forming the base regions 86, heat treatment at 950° C. for 50 minutes is done, which determines the impurity distribution.

Figure 13:
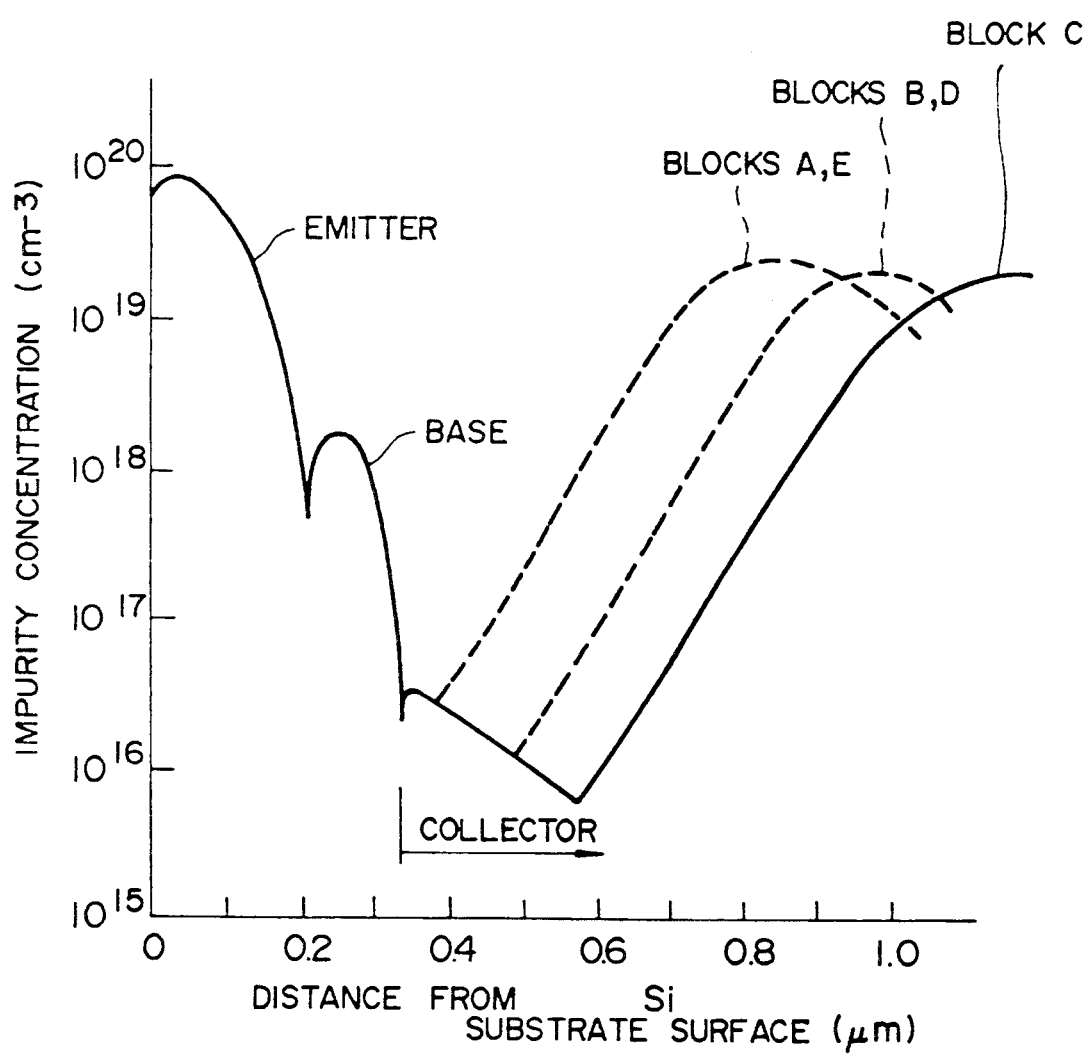
FIG. 13 is a graph showing the impurity concentration profiles in the bipolar transistors according to an embodiment of this invention.

The impurity concentration profiles in a bipolar transistor manufactured as above including the profile in the n⁺ type embedded layer 2 are shown in FIG. 13.

Following values are obtained for the cutoff frequency $f_T$ and the collector-emitter breakdown voltage $BV_{CEO}$ of the transistors in the blocks A to E disposed as shown in FIGS. 4 and 12. This breakdown voltage determines the breakdown voltage of the transistor.

| | Block | | | | |
|---|---|---|---|---|---|
| | A | B | C | D | E |
| $BV_{CEO}$ (volts) | 4 | 7 | 10 | 7 | 4 |
| $f_T$ (GHz) | 16 | 10 | 6 | 10 | 16 |
| Distance between substrate surface and embedded | 0.5 | 0.7 | 0.8 | 0.7 | 0.5 |

-continued

| | Block | | | | |
|---|---|---|---|---|---|
| | A | B | C | D | E |
| layers (μm) | | | | | |

According to the prior art, the breakdown voltage should be the same all over the chip. Then, all the blocks should have, for example, $BV_{CEO}=10$ volts and $f_T=6$ GHz. The possible high speed operability of the DRAM device has not fully extracted.

As shown in the above embodiment, the breakdown voltage $BV_{CEO}$ and the cutoff frequency $f_T$ of the respective blocks could be varied and a significant improvement in the operation speed of the DRAM device could be achieved. The access time of the DRAM device manufactured according to this embodiment was 25 ns, while a similar DRAM according to the prior art has an access time of 35 ns.

Although reference has been made to npn transistors in the above description, it is also applicable to pnp transistors. The same is true in the following description.

Figure 14:
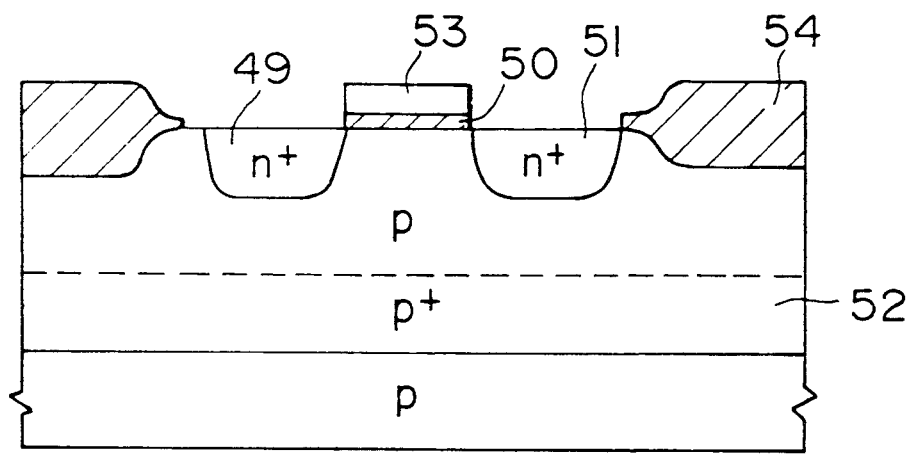
FIG. 14 is a cross-section of a p channel MOS transistor.

The technique of forming a heavily doped embedded layer by high energy ion implantation can also be applied to the MOS transistor. FIG. 14 shows a structure of a p channel transistor having a p⁺ type embedded layer 52. A pair of n⁺ type regions 49 and 51 constitute a source and a drain or a drain and a source. A gate insulator film 50 formed of an $SiO_2$ film is disposed on the surface between the source 49 and the drain 51. A gate electrode 53 is formed on the gate insulator film 50. By this technique, the depth of the p⁺ type embedded layer 52 can be controlled. By controlling the depth of p⁺ type embedded layer 52, such effects can be obtained as that the resistance to the soft errors by α particle radiation can be changed.

Figure 15A:
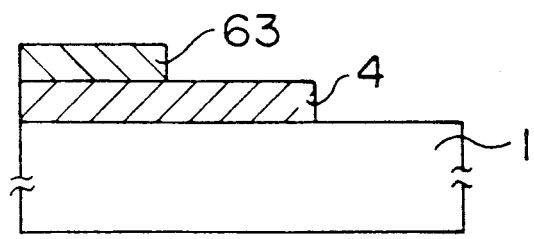
FIGS. 15a to 15c are partial cross-sections of a semiconductor substrate, illustrating the ion implantation to be achieved in an embodiment of this invention.
Figure 15B:
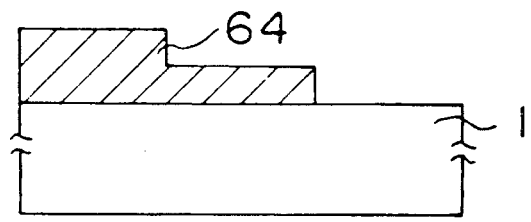
Figure 15C:
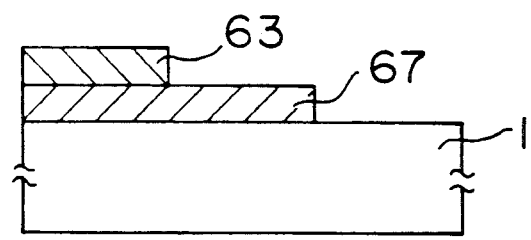

In the above embodiments utilizing the mask effect illustrated in FIGS. 11a and 11b, the mask layer formed on the silicon substrate was made only of $SiO_2$. The material is not limited to $SiO_2$. Various structures can be employed such as a combination of a photoresist layer 63 and an $SiO_2$ layer 4 as shown in FIG. 15a, an $Si_3N_4$ layer 64 having stepwisely changing film thickness as shown in FIG. 15b, and a combination of a photoresist layer 63 and an $Si_3N_4$ layer 67.

Figure 16:
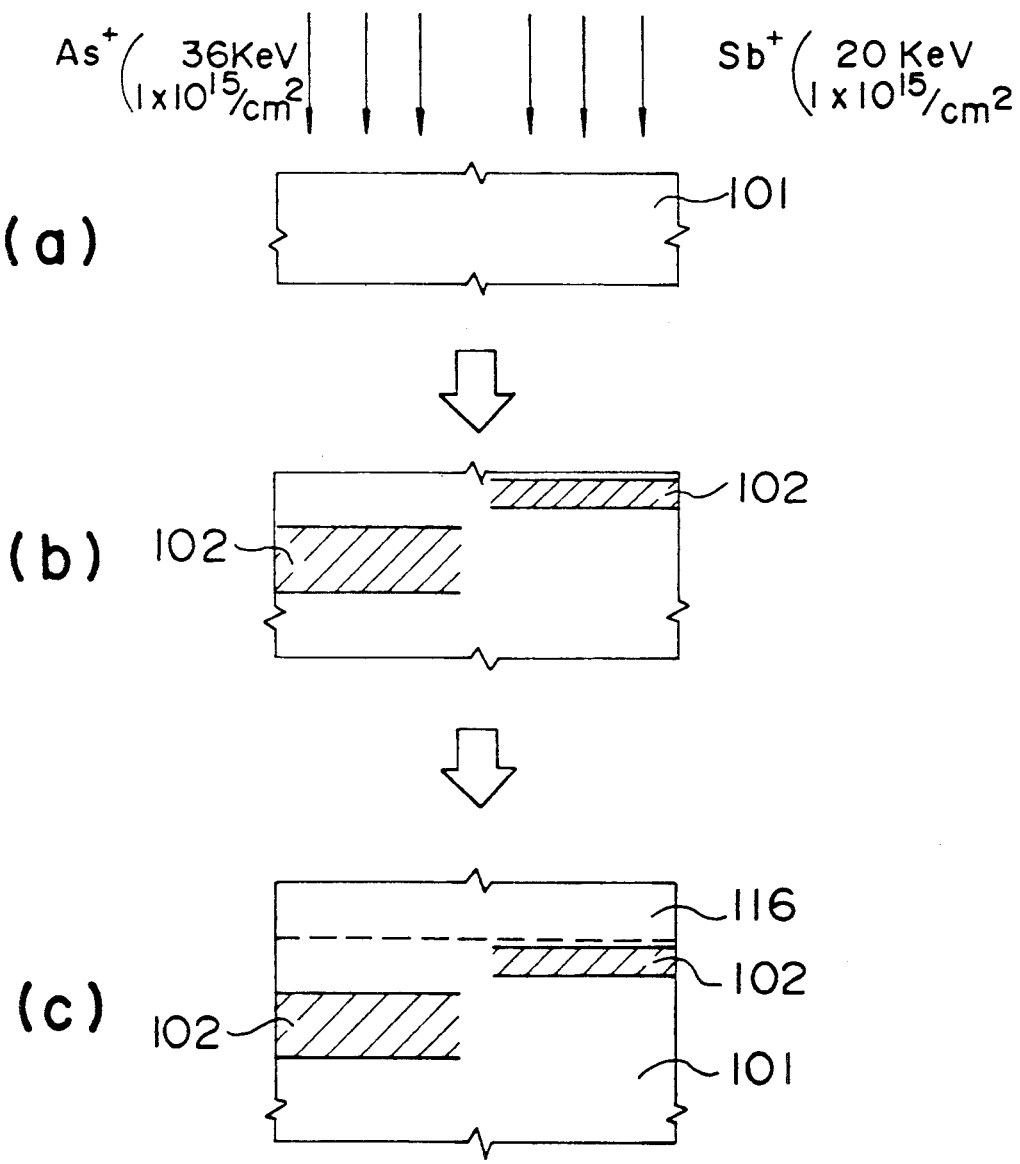
FIG. 16(a) to (c) show partial cross-sections of a semiconductor substrate, illustrating the ion implantation and epitaxial growth to be achieved in an embodiment of this invention.

Another embodiment of the method of manufacturing a substrate having the structure as shown in FIG. 4 is illustrated in FIG. 16. As shown in part (a) of FIG. 16, arsenic ions As⁺ of 360 KeV and antimony ions Sb⁺ of 20 KeV are successively and separately ion-implanted into a p type silicon substrate 101 at the respective doses of $1 \times 10^{15}/cm^2$. Then, n⁺ type embedded layers 102 are formed as shown in part (b) of FIG. 16, with the depth of the As-doped layer being deeper than the depth of the Sb-doped layer. More specifically, the Sb-doped layer is formed in the vicinity of the substrate surface, while the As-doped layer is formed in the vicinity of depth 0.2 μm.

Then, as shown in part (c) of FIG. 16, an epitaxial layer 116 is formed on the substrate 101 by epitaxial growth. Through the above processes, n⁺ type embedded layers 102 the depth of which is different by 0.2 μm according to the location.

The impurity for forming the n⁺ type embedded layer 102 is not limited to As and Sb, and may also be P, etc. Considering the impurity diffusion during the epitaxial growth process, it is desirable that the impurity for forming the deep embedded layer has a smaller diffusion constant than the impurity for forming the shallow embedded layer.

As shown in the above embodiments, the thickness of the collector region of the bipolar transistors, which has been uniformly determined by the largest value of the required breakdown voltages, can be varied according to the required breakdown voltage. Hence, the cutoff frequency can also be varied.

As the method for manufacturing such a structure, application of high energy ion implantation is raised. An oxide layer having a different film thickness on different blocks in a single chip is formed. Impurity ions are implanted at a high energy. Because the ability of the oxide layer of blocking the ions varies according to the position on the substrate, there is generated a difference in the depth of the impurity distribution implanted in the silicon substrate. Therefore, the depth of the heavily doped embedded layer can be easily adjusted.

According to the above embodiments, the width of the collector layer of bipolar transistors can be controlled by varying the depth of the highly doped embedded layer in a same chip. Therefore, the breakdown voltage and the cutoff frequency $f_T$, which is a measure of the high speed operability, of the bipolar transistor can be varied in a same chip, to produce high speed operation in the LSI device.

Figure 17A:
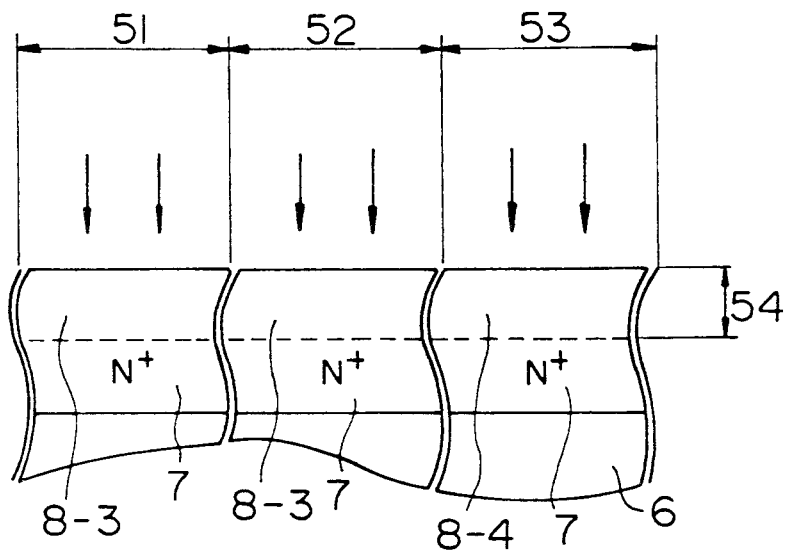
FIGS. 17a to 17c are partial cross-sections of a semiconductor substrate, illustrating various steps in the manufacture of a Bi-CMOS LSI device according to an embodiment of this invention.
Figure 17B:
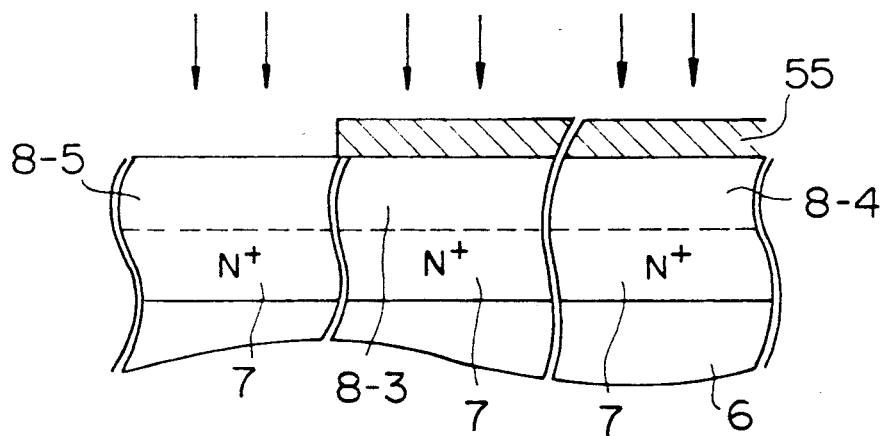
Figure 17C:
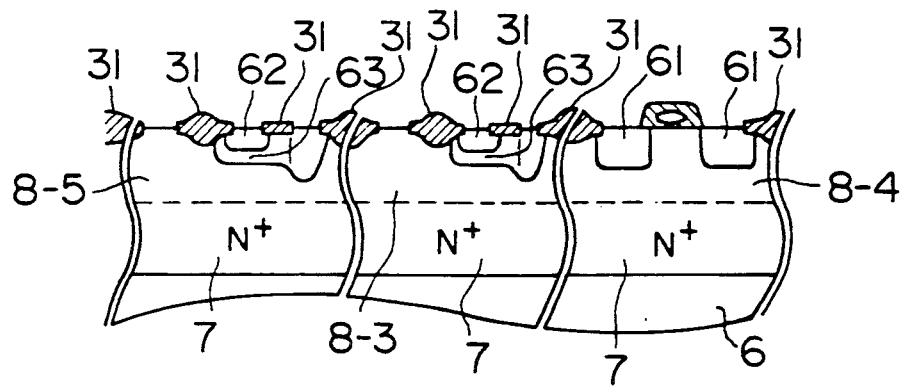

FIGS. 17a to 17c are cross-sections of a semiconductor substrate for illustrating the method for manufacturing a Bi-CMOS LSI device according to another embodiment of this invention. In the figures, reference numeral 51 denotes a block where bipolar transistors acting in the small signal range (dealing with small amplitude signals) are formed, 52 a block where bipolar transistors acting in the large signal range (dealing with large amplitude signals) are formed, and 53 a block where PMOS transistors are formed.

In the figures, n+ type embedded layers 7 are formed on the surface of a p type semiconductor substrate 6, and silicon single crystal is epitaxially grown thereon to form epitaxial layers 54 having a thickness of 1.7 μm.

Then, for forming n type wells which form collector regions of the bipolar transistors and channel layers of PMOS transistors, phosphorus ions are implanted into the epitaxial layers 54 at an acceleration energy of 125 KeV and at a dose of $2 \times 10^{12}/cm^2$, to form n type wells 8-3 which constitute the collector regions of the bipolar transistors and n type wells 8-4 which constitute channel layers of the PMOS transistors (see FIG. 17a).

Then, for increasing only the collector impurity concentration of the bipolar transistor 51 acting in the small signal range, the regions for the bipolar transistor 52 acting in the large signal range and the PMOS transistor 53 are covered with photo-resist layers 55, and phosphorus ions are implanted into the epitaxial layer 54 at an acceleration energy of 125 KeV and at a dose of $1.8 \times 10^{13}/cm^2$ to form an n type well 8-5 of a high impurity concentration (see FIG. 17b).

The above is the conditions of ion implantation for the n type well which determines the collector impurity concentration.

Then, steam oxidization at 1000° C. for 90 minutes is performed to grow field oxide films 31 to a thickness of 5000 Å to achieve the element isolation. Base regions 63 are formed by boron ion implantation at an acceleration energy of 30 KeV and at a dose of $1.5 \times 10^{14}/cm^2$. Emitter regions 62 are formed, after opening the emitter apertures, by arsenic ion implantation at an acceleration energy of 80 KeV and at a dose of $5 \times 10^{15}/cm^2$. The heat treatment for adjusting the impurity distribution after the ion implantation for forming the base regions 63 is performed under the conditions of 950° C. and 40 minutes (see FIG. 17c).

Figure 1:
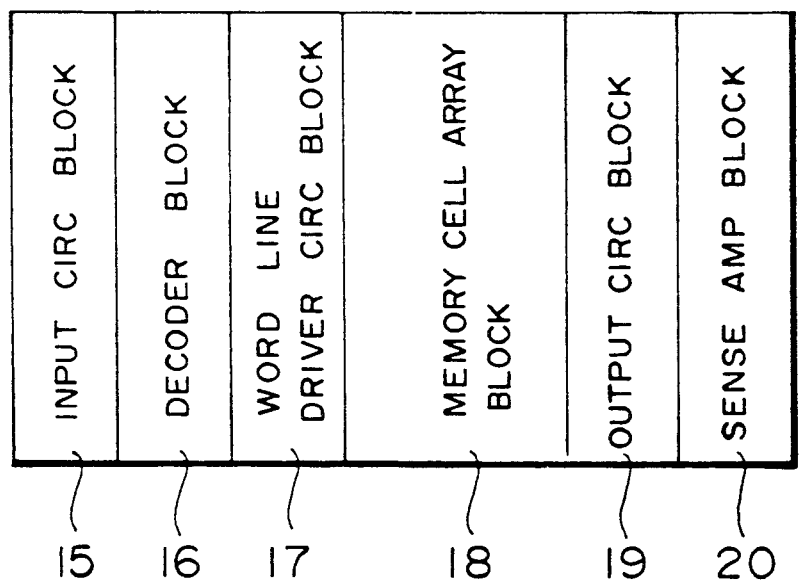
FIG. 1 is a model diagram of a DRAM device.
Figure 2:
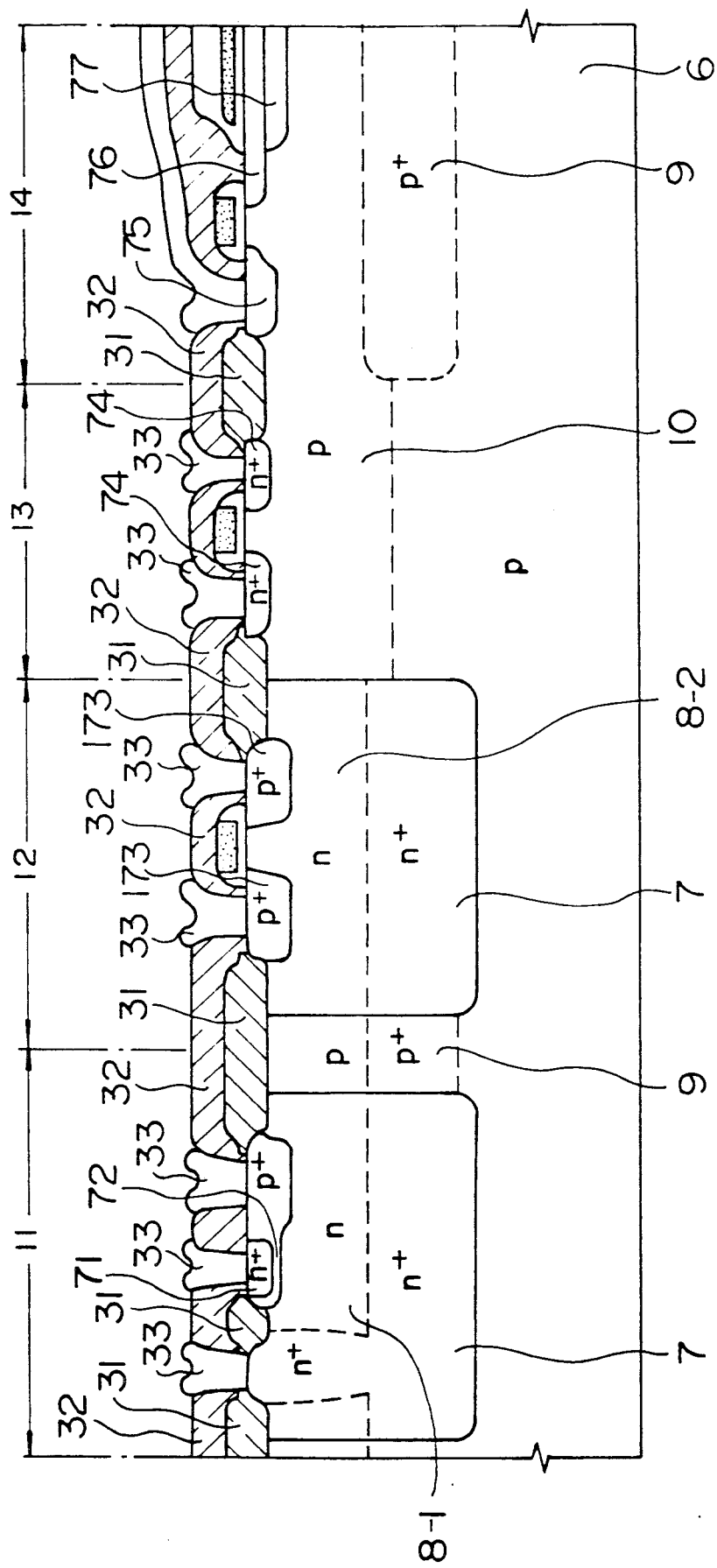
FIG. 2 is a cross-section of a part of a specific structure example of a DRAM device.

Following data are obtained for the collector-emitter breakdown voltage $BV_{CEO}$ and the cutoff frequency $f_T$ of the transistors in blocks A to E (blocks 15 to 17, 19, 20) disposed as shown in FIG. 1 or FIG. 4 with respect to various impurity concentration of n wells.

| | Block | | | | |
|---|---|---|---|---|---|
| | A(15) | B(16) | C(17) | D(19) | E(20) |
| $BV_{CEO}$[1] | 4 | 10 | 10 | 10 | 4 |
| $f_T$(GHz) | 16 | 16 | 6 | 6 | 16 |
| n well impurity concentration ($cm^{-3}$) | $1 \times 10^{17}$ | $1 \times 10^{16}$ | $1 \times 10^{16}$ | $1 \times 10^{16}$ | $1 \times 10^{17}$ |

In this way, the collector region of the bipolar transistor 51 and the channel layer of the MOS transistor 53, which has the same conductivity type as that of the collector region of said bipolar transistor 51, are formed under different conditions, while they have been formed under the same conditions by the prior art. The impurity concentration of the collector region of the bipolar transistor 51 is made higher than the impurity concentration of the channel layer. Thus, the operation speed of the Bi-CMOS LSI device can be improved.

Further, among the bipolar transistors, the collector impurity concentration of the bipolar transistor 51 acting in the small signal range is set separately from and higher than the collector impurity concentration in the bipolar transistor 52 acting in the large signal range. Then, the operation speed of the Bi-CMOS LSI device can be improved without degrading the collector-emitter breakdown voltage.

Figure 18:
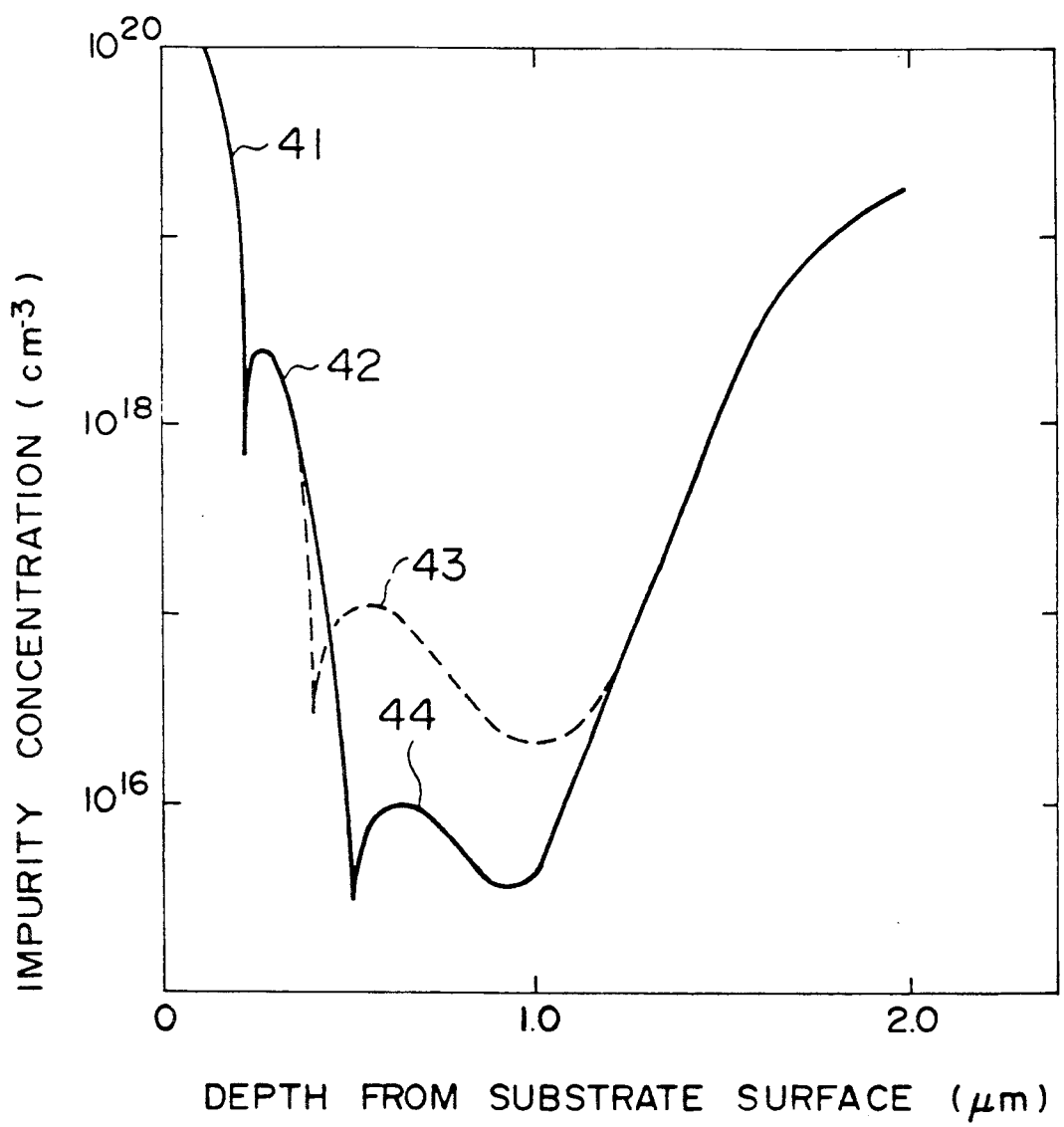
FIG. 18 is a graph showing the impurity concentration profiles in the bipolar transistor and in the MOS transistor according to an embodiment of this invention.

FIG. 18 shows the impurity distributions in a bipolar transistor manufactured under the above-described manufacturing conditions.

In the figure, a dotted curve represents an impurity concentration distribution in the bipolar transistor having a raised collector impurity concentration and a solid curve represents an impurity concentration distribution in the bipolar transistor having the ordinary collector impurity concentration. More specifically, numeral 41 denotes the distribution in the emitter region, 42 the distribution in the base region, 43 the distribution in the collector region of the bipolar transistor having the raised collector impurity concentration, and 44 the distribution in the channel layer and in the collector region of the bipolar transistor having the ordinary collector impurity concentration.

As can be seen from the figure, the collector impurity concentration of the bipolar transistor acting in the small signal region was about $1 \times 10^{17}/cm^3$, and the impurity concentration in the collector region of the bipolar transistor acting in the large signal region and in the channel region of the MOS transistor was about $1 \times 10^{16}/cm^3$.

Further, the cutoff frequency $f_T$ of these bipolar transistors made under the above-described manufacturing conditions was measured. While the cutoff frequency of the bipolar transistor acting in the large signal region was 5 GHz, the cutoff frequency of the bipolar transistor acting in the small signal region was improved to 8 GHz. by an increment of about 60%.

Further, when such transistors were incorporated in a DRAM LSI device, the access time of the DRAM could be reduced from 35 nano-seconds to 28 nano-seconds.

As has been described above, the operation speed of the Bi-CMOS LSI device can be made faster by selecting the impurity concentration in the collector region of the bipolar transistor to be higher than the impurity concentration in the channel region of the MOS transistor.

Further, in an IC device having bipolar transistors acting in the small signal range and bipolar transistors acting in the large signal range, formed in a same substrate, when only the collector impurity concentration of the bipolar transistors acting in the small signal range is made higher the operation speed of the IC device can be improved without degrading the collector-emitter breakdown voltage.

In the above-described embodiments, use is made of high energy ion implantation technique. In the following embodiment in order to provide different effective widths for collector regions of bipolar transistors in different blocks as shown in FIG. 4, for example, use is made of ion implantation into a substrate surface, formation of an epitaxial layer of a uniform thickness on the substrate and heat treatment for the formation of base and emitter regions.

Conventionally, in order to form an $n^+$ buried layer, Sb ions are implanted into that portion of a Si substrate surface in which the $n^+$ buried layer is to be formed, or otherwise, Sb is deposited and diffused into such portion of the substrate surface, and thereafter an epitaxial layer is formed on the substrate.

In this embodiment, for block C (FIG. 4) expected to have a relatively higher breakdown voltage, only Sb (antimony) ions were implanted at a dose of $1 \times 10^{15}/cm^2$, for blocks B and D expected to have next higher breakdown voltages, Sb ions were implanted at $1 \times 10^{15}/cm^2$ and additionally P (phosphorus) ions having a diffusion coefficient two order of magnitudes larger than that of Sb ions were implanted at $2 \times 10^{14}/cm^2$ and for blocks A and E expected to have relatively lower breakdown voltages, Sb ions were implanted at $1 \times 10^{15}/cm^2$ and additionally P ions were implanted at $4 \times 10^{14}/cm^2$. After the resulting substrate was annealed, an epitaxial layer was formed thereon to a thickness of 1.1 μm. Using the thus obtained structure, a Bi-CMOS memory was fabricated according to a process similar to that employed in the above-described embodiments. During the process, for formation of bipolar transistors for the various blocks, heat treatments were effected to form their base and emitter regions, when the Sb ions and P ions having been implanted into the substrate surface were further diffused toward the substrate surface, i.e., shallower with energy of the heat treatments. depending on the implantation dose and the diffusion coefficient of the impurity ions, to different depths.

Figure 19:
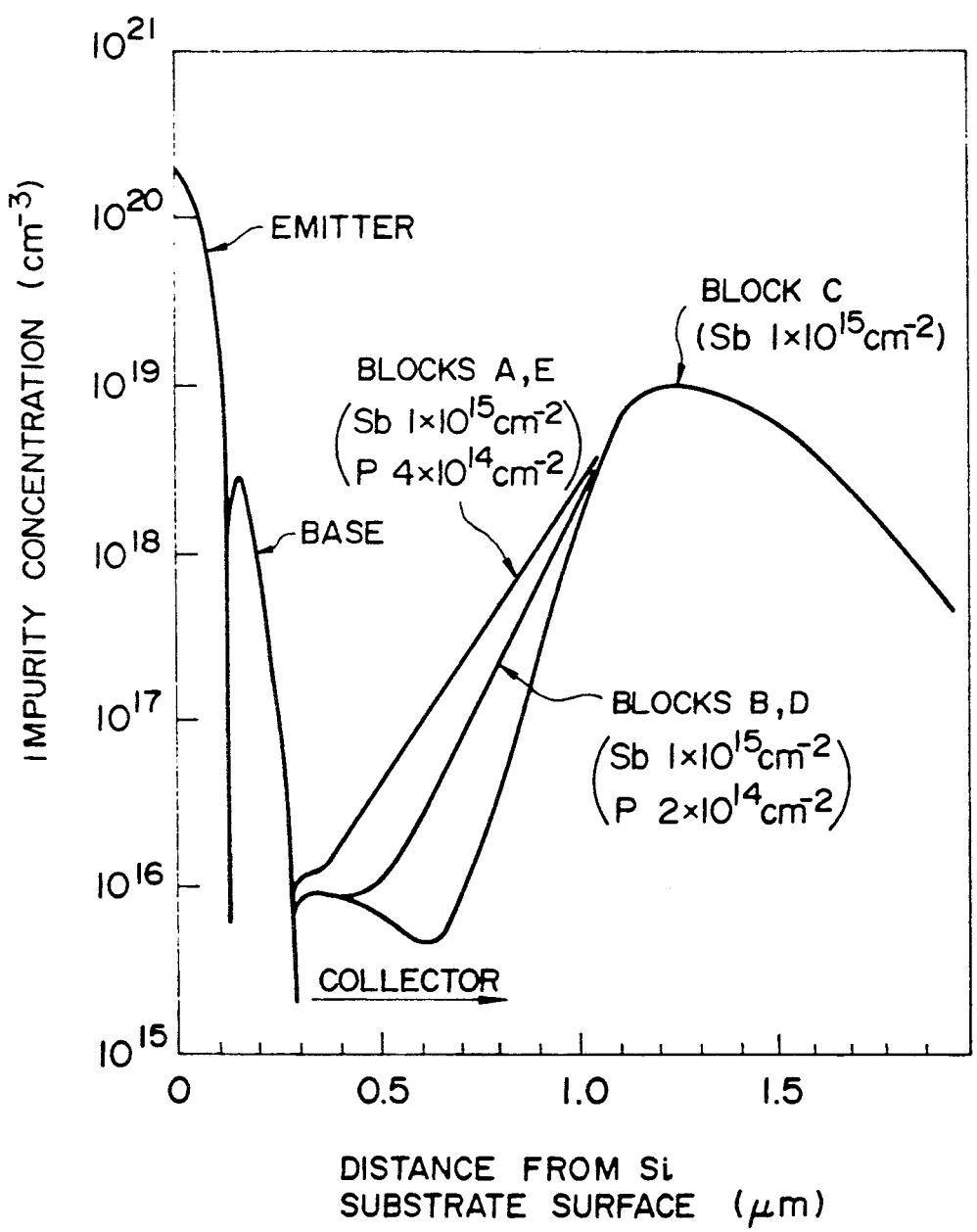
FIG. 19 is a graph showing the impurity concentration profiles in the bipolar transistors according to an embodiment of this invention.

The profile of impurity concentration distribution in the resulting transistor portions is shown in FIG. 19, from which it can be seen that the effective thickness of the epitaxial layer (collector region) is made different among the different blocks as in the above-described embodiments using high energy ion implantation technique to provide the same effects.

We claim:

1. A monolithic semiconductor IC device comprising bipolar transistor complementary MOS transistor gate (Bi-CMOS gate) blocks and emitter-coupled logic gate (ECL gate) blocks formed in a single semiconductor substrate, said Bi-CMOS gate blocks including bipolar transistors and MOS transistors formed in said single semiconductor substrate, said ECL gate blocks including other bipolar transistors formed in said single semiconductor substrate, wherein the bipolar transistors in said Bi-CMOS gate blocks are formed to have a predetermined breakdown voltage substantially equal to that of the MOS transistors in said Bi-CMOS gate blocks and the bipolar transistors in said ECL gate blocks are formed to have a predetermined breakdown voltage lower than that of the bipolar transistors in said Bi-CMOS gate blocks.

2. A monolithic semiconductor IC device comprising a plurality of blocks having different functions and formed in a single semiconductor substrate, at least two of said blocks including bipolar transistors each having an emitter region, a base region and a collector region formed in said single substrate, at least one of said at least two blocks including insulated-gate field-effect transistors each having a source region, a drain region and a channel region therebetween formed in said single substrate, wherein the collector region of at least one of the bipolar transistors in at least one of said blocks is formed to have a predetermined resistance value which is different from a predetermined resistance value of a collector region of a bipolar transistor in another block.

3. A monolithic semiconductor IC device comprising:
   first and second circuit blocks having different functions from one another, said first and second circuit blocks being formed in a single semiconductor substrate;
   a first bipolar transistor formed in said first circuit block, said first bipolar transistor having an emitter region, a base region and a collector region, wherein the collector region of said first bipolar transistor is formed to have a predetermined first electrical resistance value; and
   a second bipolar transistor formed in said second circuit block, said second bipolar transistor having an emitter region, a base region and a collector region, wherein the collector region of said second bipolar transistor is formed to have a predetermined second electrical resistance value,
   wherein at least one of said first and second circuit blocks includes an insulated-gate field effect transistor having a source region, a drain region and a channel region formed in said single semiconductor substrate, and
   wherein said predetermined first and second electrical resistance values are different from one another so that said first and second bipolar transistors in said first and second circuit blocks will have different operation speeds and different breakdown voltages from one another.

4. A monolithic semiconductor IC device according to claim 3, wherein the collector region of said first bipolar transistor has a width measured in a direction of movement of carriers in said first bipolar transistor contributing to conduction of the first bipolar transistor which is different from the width measured in a direction of movement of carriers in said second bipolar transistor in said second circuit block to provide the different first and second electrical resistance values of the collector regions of the first and second bipolar transistors in the first and second circuit blocks.

5. A monolithic semiconductor IC device according to claim 3, wherein the collector region of said first bipolar transistor has an impurity concentration different form the impurity concentration of the collector region of said second bipolar transistor to provide the first and second electrical resistance values of the collector regions of the first and second bipolar transistors in the first and second circuit blocks.

6. A monolithic semiconductor IC device according to claim 3, wherein the predetermined first electrical resistance value is smaller than the predetermined second electrical resistance value to provide said first circuit block with a higher operation speed and a lower breakdown voltage than said second block in said single semiconductor substrate.

7. A monolithic semiconductor IC device according to claim 6, wherein said first bipolar transistor in said first circuit block is arranged to operate on predetermined signals having a first amplitude level and said second bipolar transistor in said second block is arranged to operate on predetermined signals having a second amplitude level, wherein said second amplitude level is larger than said first amplitude level.

8. A monolithic semiconductor IC device according to claim 3, wherein the collector region of said bipolar transistor in said second circuit block has a conductivity type identical with and an impurity concentration higher than those of the channel region of said insulated-gate field-effect transistor.

9. A monolithic semiconductor IC device according to claim 3, wherein said second circuit block includes a memory cell array block, while said first circuit block includes first peripheral circuit blocks directly coupled to said memory array block and second peripheral circuit blocks coupled to said first peripheral circuit blocks.

10. A semiconductor device comprising a plurality of bipolar transistors and a plurality of MOS transistors, both formed in a single semiconductor substrate, said plurality of bipolar transistors having different breakdown voltages from one another, wherein predetermined ones of said bipolar transistors which comprise a direct peripheral circuit block to be directly connected to a memory cell array block are formed to have a different predetermined breakdown voltage from predetermined breakdown voltages of predetermined ones of said bipolar transistors which comprise an indirect peripheral circuit block which is not directly connected to said memory cell array block.

11. A semiconductor device according to claim 10, wherein the semiconductor device comprises a Bi-CMOS DRAM.

12. A semiconductor device comprising a plurality of bipolar transistors and a plurality of MOS transistors, both formed in a single semiconductor substrate, said plurality of bipolar transistors having different breakdown voltages and constituting different blocks having different functions from one another, wherein said single semiconductor substrate has embedded doped regions of varied levels measured from the substrate surface for the bipolar transistors, and wherein collector regions of the bipolar transistors are formed on said embedded regions to have different widths to provide said bipolar transistors with different predetermined breakdown voltages from one another, said embedded regions having an impurity concentration higher than those of said collector regions.

13. A Bi-CMOS monolithic semiconductor IC device comprising a memory cell array block, first peripheral circuit blocks including a word line driver circuit block and a sense amplifier block both directly coupled to said memory cell array block and second peripheral circuit blocks including a decoder block coupled to said word line driver circuit block, an input circuit block coupled to said decoder block and an output circuit block coupled to said sense amplifier block, said memory cell array block and said first and second peripheral circuit blocks being formed in a single semiconductor substrate, wherein:

at least said word line driver circuit block and said decoder block among said blocks include bipolar transistors each having an emitter region, a base region and a collector region formed in said single substrate, and at least one of said word line driver circuit block and said decoder block including insulated-gate field-effect transistors each having a source region, a drain region and a channel region therebetween formed in said single substrate; and the collector region of at least one of the bipolar transistors in said decoder block is formed to have a predetermined resistance value smaller than a predetermined resistance value of a collector region of a bipolar transistor in said word line driver circuit block directly coupled to said memory cell array block to provide said word line driver circuit block with a first breakdown voltage and to provide said decoder block with a second breakdown voltage lower than said first breakdown voltage.

* * * * *